United States Patent
Idani et al.

(10) Patent No.: US 7,424,688 B2
(45) Date of Patent: Sep. 9, 2008

(54) DESIGNING AND FABRICATION OF A SEMICONDUCTOR DEVICE

(75) Inventors: Naoki Idani, Kawasaki (JP); Toshiyuki Karasawa, Kawasaki (JP); Ryota Nanjo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 453 days.

(21) Appl. No.: 11/333,212

(22) Filed: Jan. 18, 2006

(65) Prior Publication Data

US 2006/0113628 A1 Jun. 1, 2006

Related U.S. Application Data

(62) Division of application No. 10/849,368, filed on May 20, 2004, now Pat. No. 7,017,133.

(30) Foreign Application Priority Data

Jan. 21, 2004 (JP) ............................. 2004-013220

(51) Int. Cl.
  *G06F 17/50* (2006.01)
(52) U.S. Cl. .................. 716/2; 716/9; 716/10; 257/499
(58) Field of Classification Search ...................... 716/2, 716/9–10; 257/499, 505
  See application file for complete search history.

(56) References Cited

U.S. PATENT DOCUMENTS 6,584,095 B1 6/2003 Jocobi et al.
2001/0026992 A1* 10/2001 Mori et al. .................. 438/424
2003/0226127 A1 12/2003 Idani
2005/0160381 A1* 7/2005 Idani et al. ...................... 716/1
2005/0224358 A1* 10/2005 Kwak et al. .................. 205/157
2007/0061768 A1* 3/2007 Travis et al. .................. 716/10

FOREIGN PATENT DOCUMENTS

JP 2001-7114 1/2001
JP 2003-347406 12/2003

* cited by examiner

*Primary Examiner*—Stacy A Whitmore
(74) *Attorney, Agent, or Firm*—Westerman, Hattori, Daniels & Adrain, LLP.

(57) ABSTRACT

Designing method of an electronic device subjected to a chemical mechanical polishing process in a fabrication process thereof is conducted according to the steps of: dividing a substrate surface into first sub-regions; optimizing a coverage ratio of hard-to-polish regions in the first sub-regions to fall in a first predetermined range corresponding to the first sub-regions; dividing the substrate surface into second sub-regions different from the first sub-regions; and optimizing a coverage ratio of the hard-to-polish regions in the second sub-regions to fall in a second predetermined range corresponding to the second sub-regions, wherein patterns having a shorter edge of 5 μm or less are excluded from the optimization.

3 Claims, 15 Drawing Sheets

INSUFFICIENT POLISHING — A

EXCESSIVE POLISHING — B

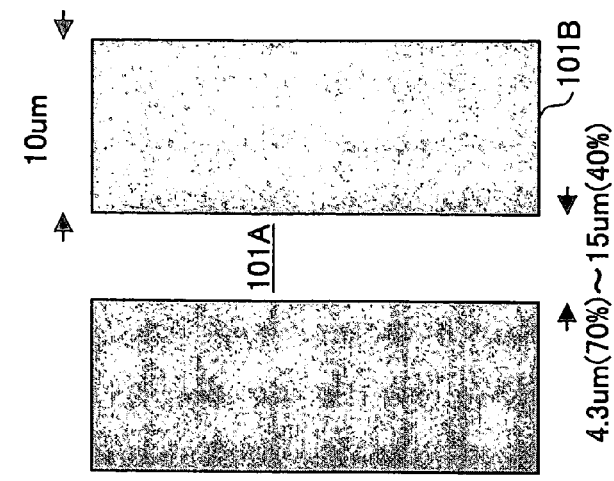
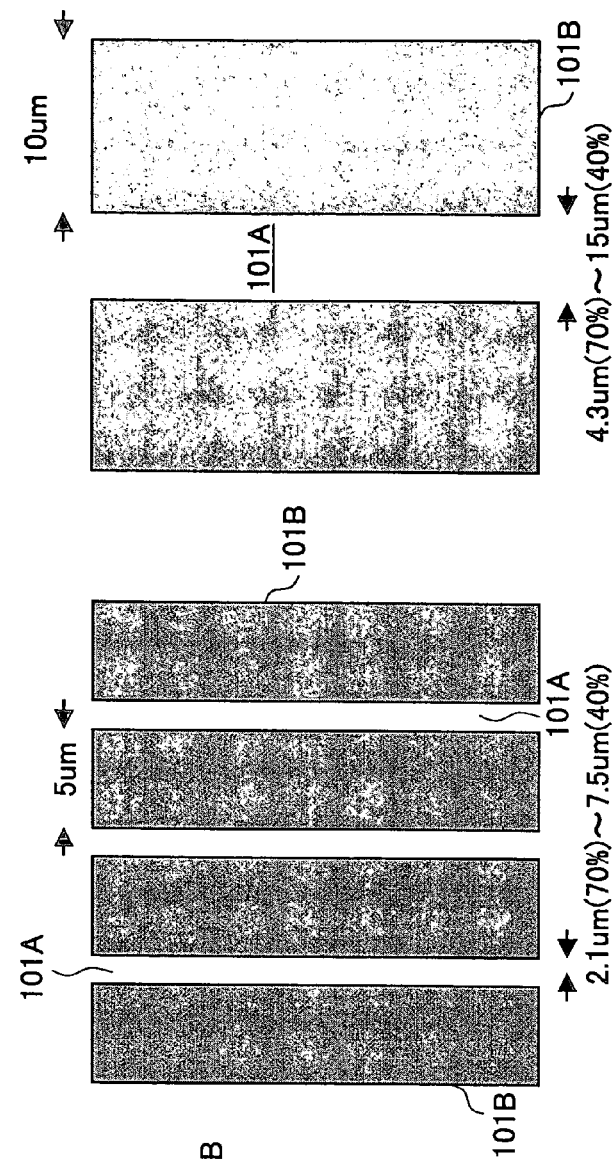
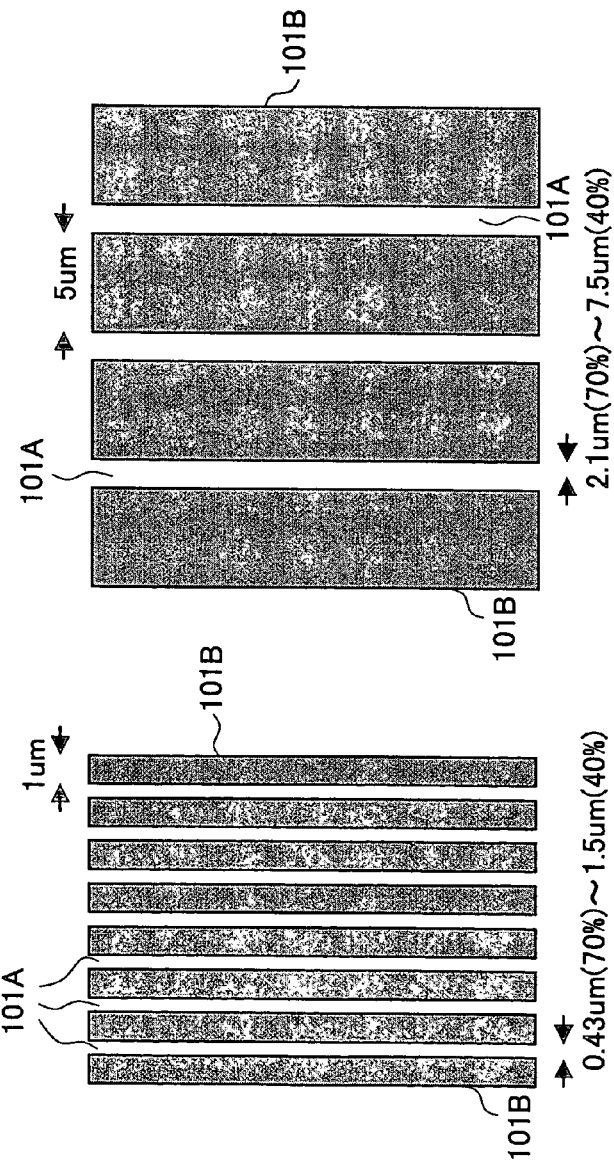
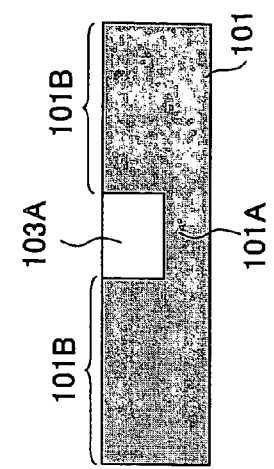
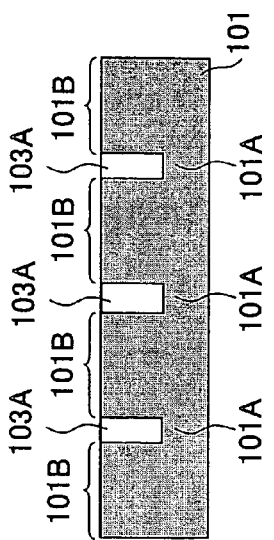
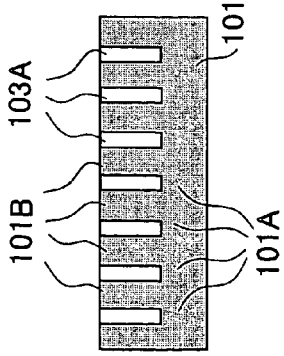

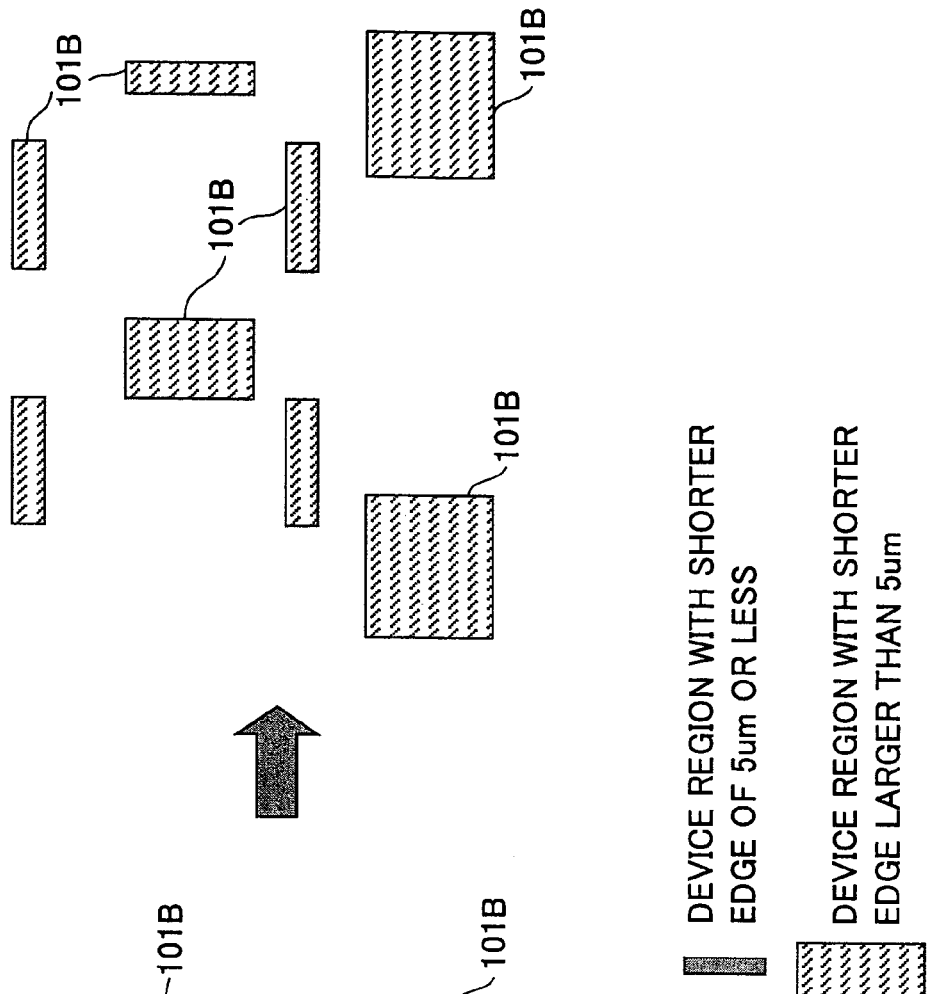
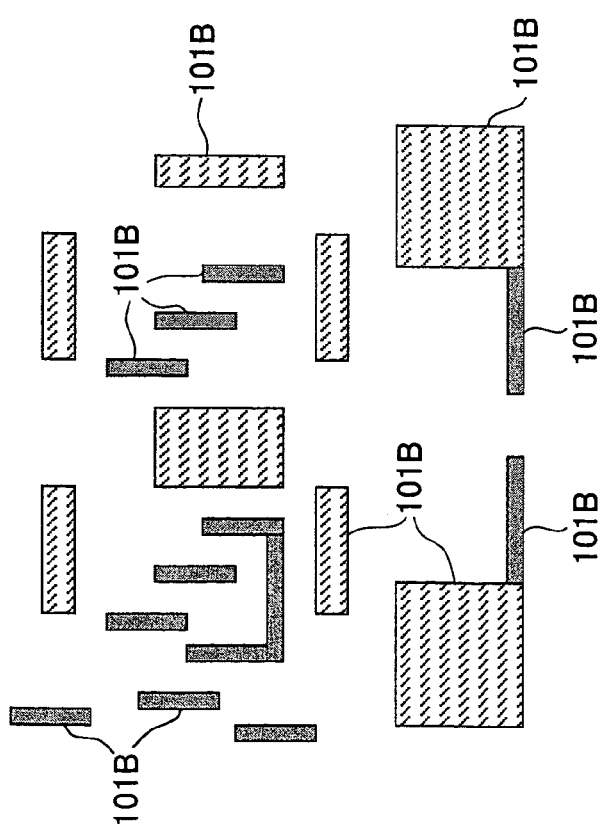
FIG.15B
FIG.15A
DEVICE REGION WITH SHORTER EDGE OF 5um OR LESS
DEVICE REGION WITH SHORTER EDGE LARGER THAN 5um ▨ DEVICE REGION WITH SHORTER EDGE OF 5um OR LESS ▨ DEVICE REGION WITH SHORTER EDGE LARGER THAN 5um

DESIGNING AND FABRICATION OF A SEMICONDUCTOR DEVICE

CROSS-REFERENCE TO RELATED APPLICATION

This application is a divisional of U.S. patent application Ser. No. 10/849,368 filed on May 20, 2004, which is based on Japanese priority application No. 2004-013220 filed on Jan. 21, 2004, the entire contents of which are hereby incorporated by reference.

BACKGROUND OF THE INVENTION

The present invention generally relates to designing of electronic devices and more particularly to a designing method of an electronic device produced by a process that includes a CMP (chemical mechanical polishing) process and a fabrication method of an electronic device that uses such a designing method. In the present invention, an electronic device includes semiconductor devices, thin film magnetic heads, CCD devices, laser diodes, and the like.

Electronic devices such as a semiconductor device or a thin film magnetic head generally has a layered structure in which plural thin films are stacked and produced generally by a process that includes a planarization process conducted by a CMP process.

In the fabrication of a semiconductor integrated circuit that includes a MOS transistor, for example, it is practiced to form an STI (shallow trench isolation) structure by the steps of forming a trench on the surface of a silicon substrate, filling the trench by an insulation film, and polishing out excessive insulation film from the surface of the silicon substrate by a CMP process.

FIGS. 1A-1E show a typical conventional process of forming an STI structure.

Referring to FIG. 1A, a silicon oxide film 12 is formed on a surface of a silicon substrate 11 by a thermal oxidation processing, and a silicon nitride film 13 is formed further thereon by a sputtering process, CVD (chemical vapor deposition) process, and the like.

Next, in the step of FIG. 1B, the silicon nitride film 13 is patterned in a predetermined region where the device isolation region is to be formed, and the silicon oxide film 12 and the underlying silicon substrate 11 are patterned while using the silicon nitride pattern thus formed as a mask to form a trench 14 in the silicon substrate 11.

Next, in the step of FIG. 1C, a thermal oxide film 15 is formed on the inner wall surface of the trench 14, and the trench 14 thus formed with the thermal oxide film 15 is filled with an insulation film 16 by depositing the same on the silicon substrate 11 by a high density plasma CVD process that may use $SiH_4$ and $O_2$ for the source gas. Further, in the step of FIG. 1D, the excessive insulation film 16 on the silicon substrate 11 is removed by a polishing process conducted by a CMP process. Thereby, the nitride film pattern 13 functions as a polishing stopper.

Further, in the step of FIG. 1E, the silicon nitride film 13 and the oxide film 12 are removed by respective wet etching processes, and there is formed an STI device isolation region 17 in which the device isolation trench 14 is filled with the silicon oxide film 16 is obtained so as to define a device region 18 on the silicon substrate 11.

Meanwhile, it is known that the flatness of the silicon substrate 11 thus polished by a CMP process changes depending on the layout of the device elements formed on the silicon substrate 11.

For example, in the case in which the device regions 18 are sparse on the substrate and hence there extends a wide device isolation region 17 between adjacent device regions 18 in FIG. 1E, the insulation film 16 has to fill the wide device isolation trench 14 having a large volume in the step of FIG. 1C, and thus, the film thickness on the silicon substrate 11 is tend to be reduced. In the case the device regions 18 are formed densely on the substrate 11, on the other hand, the device isolation trenches 14 have a reduced width, and thus, the insulation film 16 is deposited on the silicon substrate 11 with increased thickness.

Thus, in the case of polishing a wafer in which the device regions are formed with a density that changes depending on the location on the wafer by a CMP process, there is a possibility that polishing becomes excessive in the regions where the insulation film 16 has a small thickness and insufficient in the regions where the insulation film 16 has a large thickness.

FIG. 2 shows an example of a silicon substrate 30 in which the density of the device region varies depending on the location of the substrate.

Referring to FIG. 2, it can be seen that there are formed device regions 31 having a size of 500 µm at each edge repeatedly in a first region A of the substrate for the overall length of about 1 mm, and device isolation regions 32 having a width of about 1 µm are formed between adjacent device regions 31. On the other hand, as shown in enlarged view of FIG. 2, there is formed a second region B on the substrate adjacent to the second region A in such a manner that square regions 33 each having a size of 0.5 µm for each edge are formed over the length of about 1000 µm, such that each square region 33 is separated from an adjacent square region 33 by a device isolation region 33 having a size of 1 µm.

FIG. 3 is a cross-sectional diagram of the substrate 30 of FIG. 2 in which the device isolation trench in the substrate 30 is filled with a silicon oxide film 35 corresponding to the insulation film 16 according to the process steps of FIGS. 1A-1E in the state in which the excessive silicon oxide film 35 on the substrate 31 is removed by a CMP process.

Referring to FIG. 3, there occurs a thick deposition of the silicon oxide film 35 (thickness=$t_1$) on the device region 31 in the region A where the device regions are formed with large density, as represented by a broken line. In such a region, there remains a silicon oxide film residue 35X after the CMP process conducted on a silicon nitride film corresponding to the silicon nitride film 13 noted before, and thus, there appears a state of insufficient polishing.

In the region B where the density of the device region is small, on the other hand, there occurs a dip (erosion) in the silicon oxide film 35 deposited with a reduced film thickness (thickness=$t_2$, $t_2 < t_1$) as represented by a broken line, and there appears a state of excessive polishing.

In this way, there can be caused both a region of insufficient polishing and a region of excessive polishing on a single substrate when there exist a region in which the device regions are formed densely and a region in which the device regions are formed sparsely. It should be noted that, once such a state is caused, it cannot be resolved even when optimization of polishing rate is made by way of optimization of polishing time, and the like.

In order to solve this problem and to secure uniformity of polishing process, there is a proposal to add dummy device regions to the part of the substrate surface where the device regions 18 are formed with sparse interval, such that the density of the device regions is maintained uniformly all over the entire substrate surface.

For example, Japanese Laid-Open Patent Application 2001-7114 proposes the technology of dividing the silicon substrate surface into sub-regions and imposing a limitation on such sub-regions with regard to a coverage ratio, which is the proportion of the area of the sub-region occupied by the device regions, for ensuring uniform polishing.

FIG. 4 shows an example of such sub-regions formed on a silicon substrate surface.

Referring to FIG. 4, each of the sub-regions has a size of 100 μm×100 μm in the illustrated example, and there are formed sub-regions 51 represented without hatching and sub-regions 52 represented with hatching. Here, the sub-regions 51 have a coverage ratio of 80%, while the sub-regions 52 have a coverage ratio of 20%. It will be noted that the sub-regions 51 and the sub-regions 52 are disposed at random on the substrate. As noted above, the coverage ratio is defined for each sub-region as the total area of the device regions in a sub-region divided by the area of that sub-region.

In this conventional art, it becomes possible to realize uniform polishing in the CMP process of FIG. 1D, provided that the sub-regions of different coverage ratios are distributed at random on the substrate. On the other hand, in the case there exists a deviation in the pattern of the sub-regions on the substrate such that the sub-region of particular coverage ratio cluster together in a particular part of the substrate, for example, the problem of non-uniform polishing in the CMP process cannot be avoided with the technology of this prior art.

On the other hand, the inventor of the present invention has proposed, in the Japanese Laid-Open Patent Application 2003-347406, a technology capable of ensuring uniform polishing in the CMP process by: dividing the substrate surface into small sub-regions shown in FIG. 5; conducting layout of a semiconductor device such that the coverage ratio falls in a particular range for each of the small sub-regions; re-dividing the substrate surface into large sub-regions 53 and 54 having a size of 300 μm or more for each edge as shown in FIG. 6; and modifying the layout such that the coverage area of the device regions falls in a predetermined range in each of the large sub-regions 53 and 54. In the examples of FIGS. 5 and 6, it should be noted that the small sub-regions 51 and 52 have a size of 250 μm for each edge.

Thus, by modifying the layout such that the coverage ratio of the device region falls in a predetermined area also in such large sub-regions, non-uniform distribution of the device region in the large sub-regions 56 and 57 such as the one shown in FIG. 7 is eliminated, and uniform polishing is ensured in the CMP process of FIG. 1C.

SUMMARY OF THE INVENTION

Meanwhile, it should be noted that the design rule of 90 nm or less, such as 50 nm or 45 nm, is beginning to be used in the fabrication of ultrafine semiconductor devices of these days. With this, such ultrafine semiconductor devices are using a correspondingly miniaturized gate length.

Further, it should be noted that, at the time of integration of such ultrafine semiconductor devices on a silicon substrate, there frequently occurs a demand to form the ultrafine semiconductor devices in a minute device region having a size of 5 μm or less, such as 1-3 μm.

For example, there can be a demand for disposing device regions of rectangular form having a width or shorter edge of about 3 μam or less in each of the large sub-regions having a size of 300 μm or less for each edge, with the coverage ratio of about 70%. Such a situation can arise in the case of forming standard cells on a chip, for example.

Now, when there is imposed a restriction that the coverage ratio of the device regions in the large sub-region should be 50% or less, there occurs a conflict between the requirements and the design of the semiconductor device is refused. In such a case, it is not possible to design a semiconductor device.

In this way, it is often difficult, when forming ultrafine and hence ultra high-speed semiconductor devices on the device regions having a very small edge length, to dispose the small sub-regions 51 and 52 in the large sub-regions 53 and 54 so as to satisfy the restriction for the coverage ratio, even though it may be possible to layout the semiconductor devices such that the restriction on the coverage ratio is satisfied for the small sub-regions 51 and 52. Further, it should be noted that when the location of the device on the substrate is changed in such ultra high-speed semiconductor devices, there is caused a corresponding change of wiring length, leading to error in the signal timing. In such a case, it becomes necessary to re-design the entire circuit.

Accordingly, it is a general object of the present invention to provide a novel and useful designing method of an electronic device, a fabrication method of an electronic device that uses such a designing method, and an electronic apparatus designed according to such a designing method.

According to a first aspect of the present invention, there is provided a designing method of an electronic device, comprising:

a first extraction step that extracts a first sub-region from a layout region, said layout region including easy-to-polish regions showing a large polishing rate in a chemical mechanical polishing process and hard-to-polish regions showing a smaller polishing rate in said chemical mechanical polishing process;

a first layout step comprising the steps of: obtaining a ratio of an area of said first sub-region occupied by said hard-to-polish regions to an area of said first sub-region as a first coverage ratio; comparing said first coverage ratio with a first allowable coverage ratio, said first allowable coverage ratio indicating an allowable area of said first sub-region occupied by said hard-to-polish regions to said area of said first sub-region for achieving a flatness after said chemical mechanical polishing process; and increasing an area of said easy-to-polish regions when said first coverage ratio exceeds said first allowable coverage ratio, increasing said area of said hard-to-polish regions when said first coverage ratio is smaller than said first allowable coverage ratio;

a second extraction step that extracts a second sub-region larger than said first sub-region from said layout region; and a second layout step comprising the steps of: obtaining a ratio of an area of said second sub-region occupied by said hard-to-polish region to an area of said second sub-region as a second coverage ratio; comparing said second coverage ratio with a second allowable coverage ratio, said second allowable coverage ratio indicating an allowable area of said second sub-region occupied by said hard-to-polish regions to said area of said second sub-region for achieving a flatness after said chemical mechanical polishing process; and increasing said area of said easy-to-polish regions when said second coverage ratio exceeds said second allowable coverage ratio, increasing said area of said hard-to-polish regions when said second coverage ratio is smaller than said second allowable coverage ratio, said designing method further comprising a step, before said first and second extraction steps, of excluding easy-to-polish regions having an edge length of 5 μm or less for a shorter edge thereof from said layout region.

In a second aspect of the present invention, there is provided a method of fabricating an electronic device having a substrate, said substrate including therein an easy-to-polish region showing a large polishing rate to a chemical mechanical polishing process and a hard-to-polish region showing a smaller polishing rate to said chemical mechanical polishing process, said method comprising:

a layout step, said layout step comprising: a first extraction step that extracts a first sub-region from a layout region; a first sub-layout step comprising the steps of obtaining a ratio of an area of said first sub-region occupied by said hard-to-polish regions to an area of said first sub-region as a first coverage ratio, comparing said first coverage ratio with a first allowable coverage ratio, said first allowable coverage ratio indicating an allowable area of said first sub-region occupied by said hard-to-polish regions to said area of said first sub-region for achieving a flatness after said chemical mechanical polishing process, and increasing an area of said easy-to-polish regions when said first coverage ratio exceeds said first allowable coverage ratio, increasing an area of said hard-to-polish regions when said first coverage ratio is smaller than said first allowable coverage ratio; a second extraction step that extracts a second sub-region larger than said first sub-region from said layout region; and a second sub-layout step comprising the steps of obtaining a ratio of an area of said second sub-region occupied by said hard-to-polish region to an area of said second sub-region as a second coverage ratio, comparing said second coverage ratio with a second allowable coverage ratio, said second allowable coverage ratio indicating an allowable area of said second sub-region occupied by said hard-to-polish regions to said area of said second sub-region for achieving a flatness after said chemical mechanical polishing process, and increasing said area of said easy-to-polish regions when said second coverage ratio exceeds said second allowable coverage ratio, increasing said area of said hard-to-polish regions when said second coverage ratio is smaller than said second allowable coverage ratio;

a step, after said layout step, of forming a depression on a surface of said substrate in correspondence to said easy-to-polish region;

a step of depositing an insulation film on said substrate surface by a high-density plasma CVD process such that said insulation film fills said depression; and a step of removing said insulation film from said substrate surface by a chemical mechanical polishing process, wherein said layout step further comprises the step, before said first and second extraction steps, of excluding easy-to-polish regions having an edge length of 5 µm or less for a shorter edge thereof from said layout region.

In a further aspect of the present invention, there is provided an electronic device, comprising:

a substrate;

device regions formed on said substrate; and device isolation regions formed on said substrate, said device regions being formed to occupy an area of 70% or less of said substrate in a region thereof having a size of 100 µm per each edge in the case patterns having an edge length of 5 µm or less for a shorter edge are eliminated, said patterns having an edge length of 5 µm or less for said shorter edge being formed so as to occupy an area of 70% or more in regions on said substrate having a size of 100 µm for each edge.

According to the present invention, it becomes possible to achieve uniform polishing of a substrate both locally and globally at the time of designing or fabrication of an electronic device including both easy-to-polish regions and hard-to-polish regions, by optimizing the coverage ratio of the hard-to-polish region separately for the first sub-regions and for the second sub-regions having a different area.

Thereby, it should be noted that the present invention is based on the discovery that the patterns having an edge length of 5 µm or less for the shorter edge thereof does not provide influence on the chemical mechanical polishing at the time of optimization of the layout of the electronic devices and enables designing with high degree of freedom by excluding the ultrafine patterns having an edge length of 5 µm or less for the shorter edge thereof from the calculation of the coverage ratio.

Further, according to an electronic device of the present invention, it becomes possible to form electronic devices having desired ultrafine patterns with high degree of freedom.

Other objects and further features of the present invention will become apparent from the following detailed description when read in conjunction with the attached drawings.

BRIEF DESCRIPTION OF THE DRAWINGS

FIGS. 8A-8F are diagrams showing the specimen used in the experiments that constitute the foundation of the present invention;

FIGS. 15A and 15B are diagrams showing example of the design of an electronic device according to an embodiment of the present invention;

DETAILED DESCRIPTION OF THE INVENTION

[Principle]

First, the principle of the present invention will be explained with reference to FIGS. 8A-8F and FIG. 9.

In the investigation that constitutes the foundation of the present invention, the inventor of the present invention has conducted a series of experiments by forming specimens shown in FIGS. 8A-8C and FIGS. 8D-8F, such that the coverage ratio of the device regions defined on the substrate by the device isolation trenches changes variously. It should be noted that the plan view diagrams of FIGS. 8A-8C correspond respectively to cross-sectional view diagrams of FIG. 8D-8F. Further, the inventor of the present invention has prepared a specimen shown in FIG. 9 in which minute device regions are disposed at random on the surface of the substrate.

Referring to FIGS. 8A and 8D, there are formed device regions 101B in a silicon substrate 101 in the form of parallel stripe pattern having a width of 1 µm such that each device region 101B is defined by a pair of device isolation trenches 101A of which width is changed from 0.43 µm to 1.5 µm. Thereby, the coverage ratio of the device regions 101B, which is defined as the proportion of the area of the substrate covered with the device regions 101B is changed in the range of 40-70%.

In the specimen of FIGS. 8B and 8E, on the other hand, there are formed device regions 101B in the form of parallel stripe pattern with a width of 5 µm such that each device region 101B is defined by a pair of device isolation trenches 101A of which width is changed from 2.1 µm to 7.5 µm. Thereby, the coverage ratio of the device regions 101B is changed in the range of 40-70%.

Further, in the specimen of FIGS. 8C and 8F, it can be seen that there are formed device regions 101B in the form of parallel stripe pattern with a width of 10 µm such that each device region 101B is defined by a pair of device isolation trenches 101A of which width is changed from 4.3 µm to 1.5 µm. Thereby, the coverage ratio of the device regions 101B is changed in the range of 40-70%.

Figure 9:
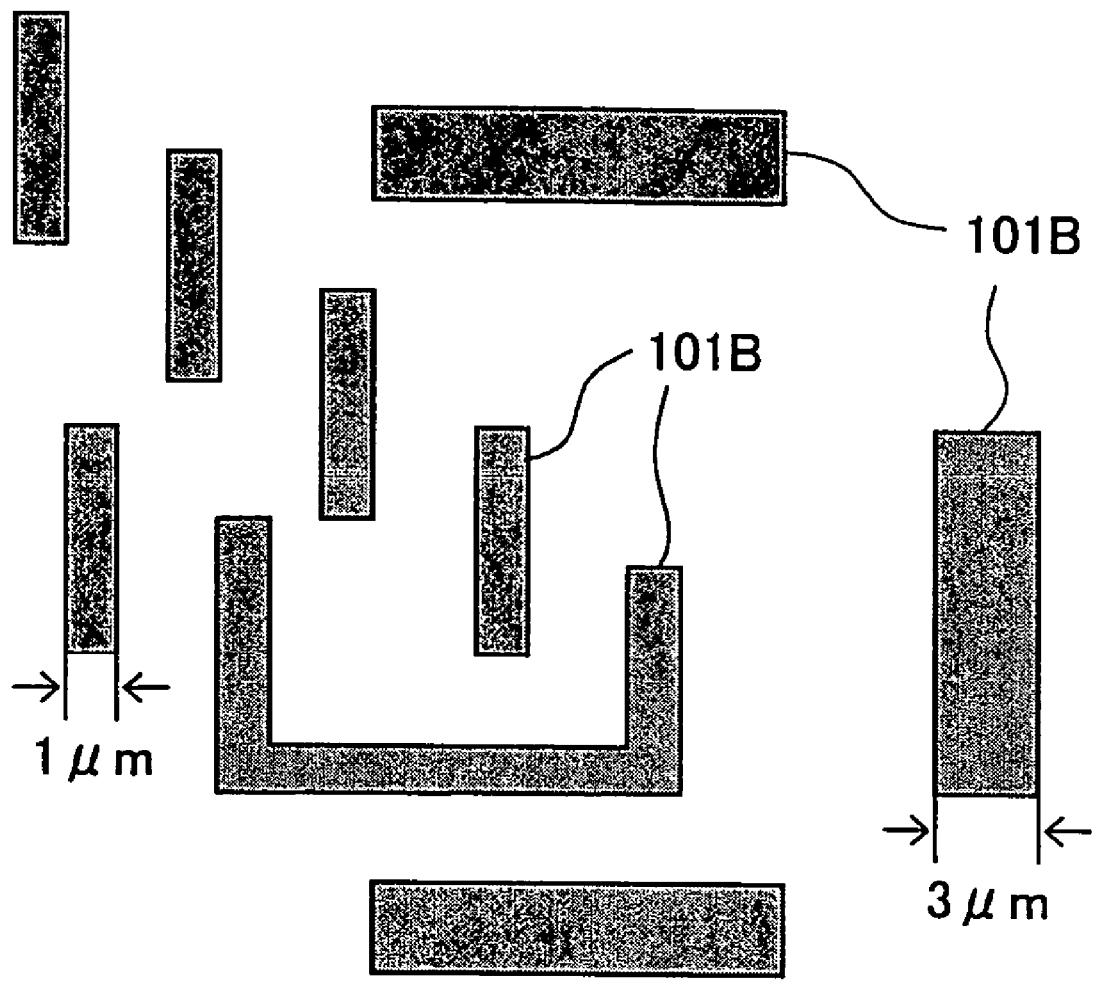
FIG. 9 is a diagram showing another specimen used in the experiments that constitute the foundation of the present invention.

Further, in the specimen of FIG. 9, device regions having a width of 1-3 µm and a cross-section similar to that of FIG. 8D are disposed at random on the surface of the silicon substrate 101 with a coverage ratio of 70%.

Figure 10A:
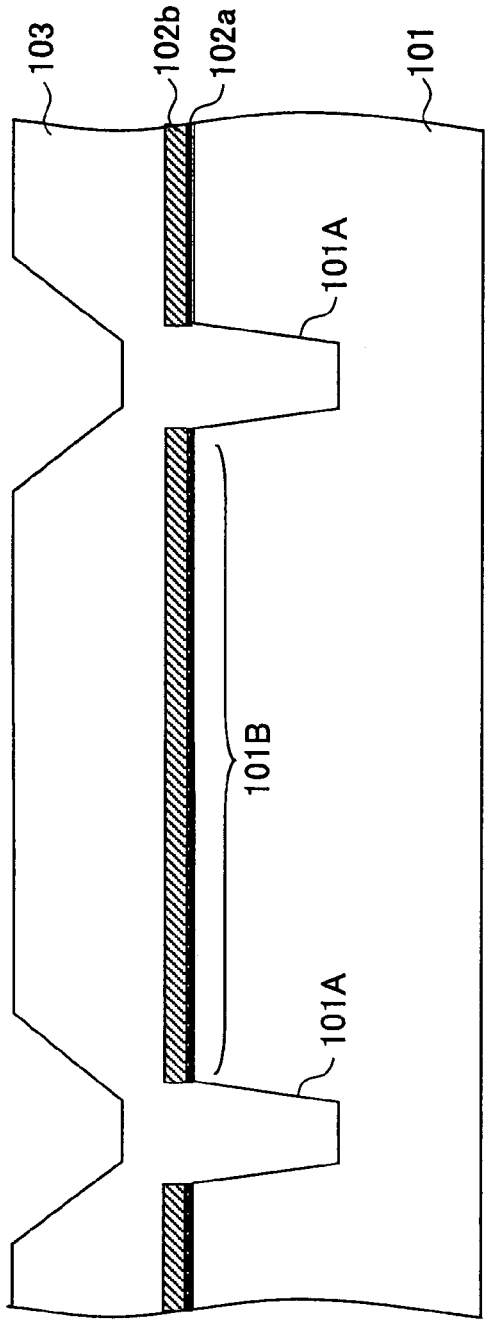
FIGS. 10A and 10B are diagrams showing the state in which a silicon oxide film is deposited by a high-density plasma CVD process so as to fill a depression in the experiments constituting the foundation of the present invention.
Figure 10B:
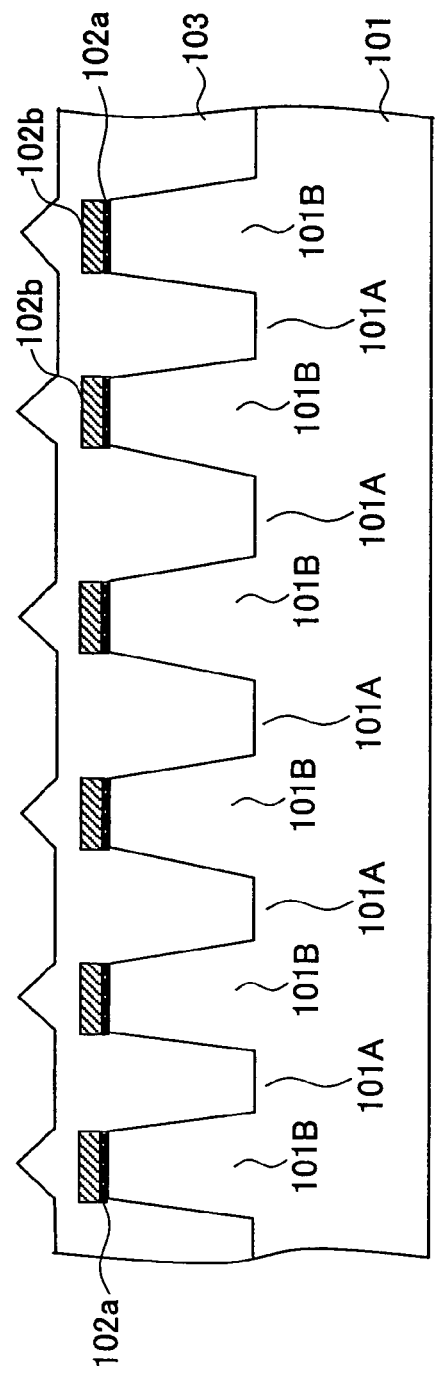

FIG. 10A shows the specimen of FIG. 8B or 8C in the state in which the device isolation trenches 101A are filled with a silicon oxide film 103 deposited by a high-density plasma CVD process, while FIG. 10B shows the specimen of FIG. 8A or FIG. 9 in which the device isolation trenches 101A are filled with a silicon oxide film 103 deposited by a similar plasma CVD process. Typically, the silicon oxide film is deposited by using an ICP (induction-coupled plasma) type or ECR type plasma CVD apparatus under the pressure of about 665 mPa at the substrate temperature of 600° C., while supplying source gases of $SiH_4$ and $O_2$ together with a carrier gas of He while applying an RF power of 13.56 MHz frequency with the electric power of 2000 W. Further, a high-frequency power of 13.56 MHz frequency is applied to the substrate to be processed with an electric power of 4000 W.

Referring to FIGS. 10A and 10B, there is formed a silicon nitride film 102b on the silicon substrate 101 via a thermal oxide film 102a, and the silicon oxide film 103 is deposited on the silicon substrate 101 via the thermal oxide film 102a and the silicon nitride film 102b. Further, the device isolation trench 101A are formed by dry etching the silicon substrate 101 while using the silicon nitride film 102b as a mask.

In the case the silicon oxide film 103 is deposited by using the high-density plasma CVD process, the silicon oxide film experiences plasma etching simultaneously to deposition, and as a result, there is formed a depression of trigonal pyramid form having a triangular cross section and defined by facets in correspondence to the device isolation trench 101A as represented in FIG. 10A in the case the device regions 101B have a large size or width. On the other hand, in the case the device regions has a small width or size, there are formed triangular projections of trigonal pyramid form defined by facets in correspondence to the device regions.

Further, in the case of FIG. 10B in which the width of the device region 101B is small, it should be noted that the thickness of the excessive silicon oxide film 103 remaining on the silicon substrate 101, more precisely remaining on the silicon nitride film 102b, is reduced as compared with the case of FIG. 10A where the device region 101B has a large width as a result of the etching action of the high-density plasma CVD process, even in the case there exist a number of ultrafine device regions 101B on the substrate 101 and thus the total area of the device regions 101B is large.

Figure 11A:
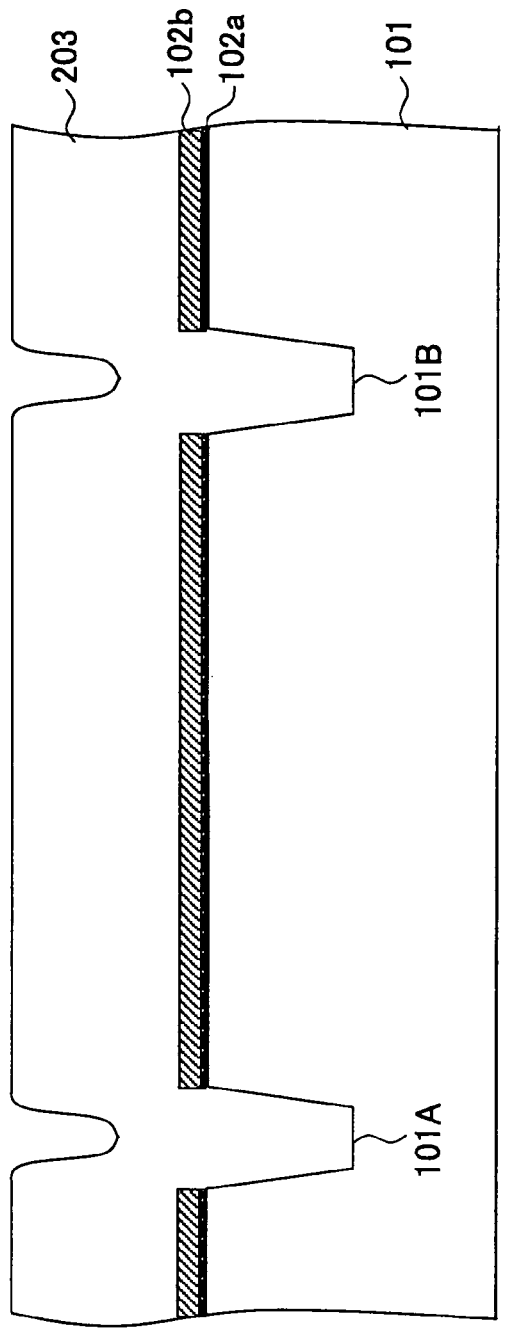
FIGS. 11A and 11B are diagrams showing the state in which a similar silicon oxide film is deposited by an ordinary plasma CVD process.
Figure 11B:
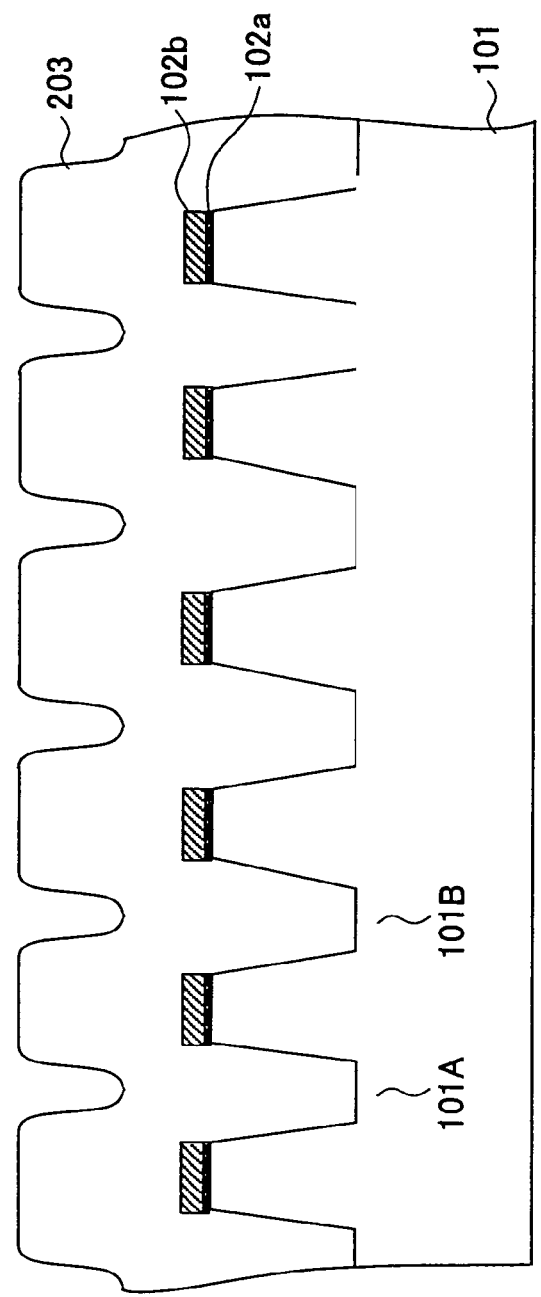

FIGS. 11A and 11B show the examples in which the silicon oxide film 203 is formed by an ordinary plasma CVD process in the structures of FIGS. 10A and 10B.

Referring to FIGS. 11A and 11B, it can be seen that the silicon oxide film 203 is deposited with a large thickness, irrespective of the size of the device region, in the case an ordinary plasma CVD process is used and the total area of the device regions is large.

The inventor of the present invention has studied the relationship between the quality of polishing and the occupation ratio of the device regions on the substrate for the structure of FIGS. 10A and 10B explained before, by conducting a polishing experiment for polishing out the silicon oxide film 103. In the experiment, an CMP apparatus shown in FIG. 12 was used.

Figure 12:
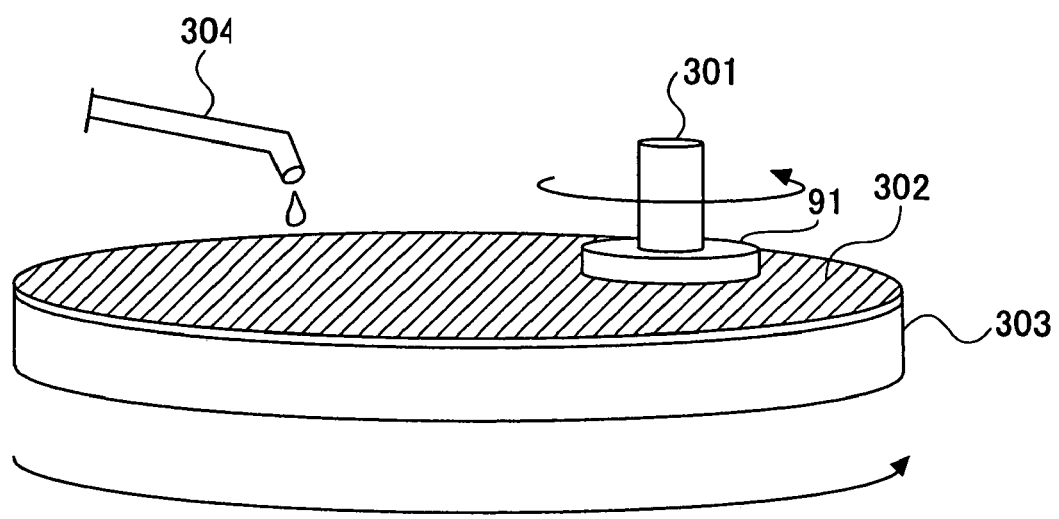
FIG. 12 is a diagram showing the chemical mechanical polishing process used for removing the silicon oxide film in the experiments constituting the foundation of the present invention.

Referring to FIG. 12, the CMP apparatus 300 includes a polishing head 301 for holding a substrate 91 to be polished, a polishing table 303 carrying a polishing pad 302, a slurry supplying nozzle 304 for supplying a slurry to the polishing pad 302, and the like, wherein the polishing experiments have been conducted by applying a load of 0.3 $kgw/cm^2$ to the substrate 91 and rotating the polishing table 303 such that a linear polishing velocity of 13 m/sec is realized, while supplying a slurry containing ceria with a concentration of about 1 wt % at the flow rate of about 0.2 L/second. For the polishing pad 302, IC1400 marketed from Rodel-Nitta has been used.

Figure 1A:
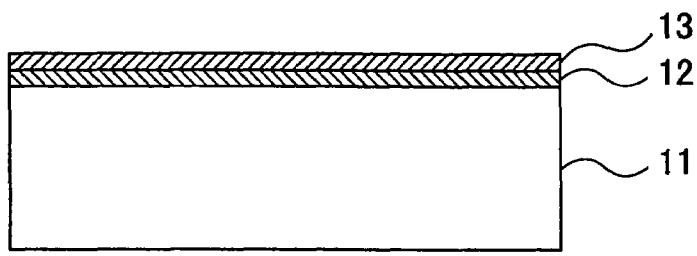
FIGS. 1A-1E are diagrams showing conventional STI process steps.
Figure 1B:
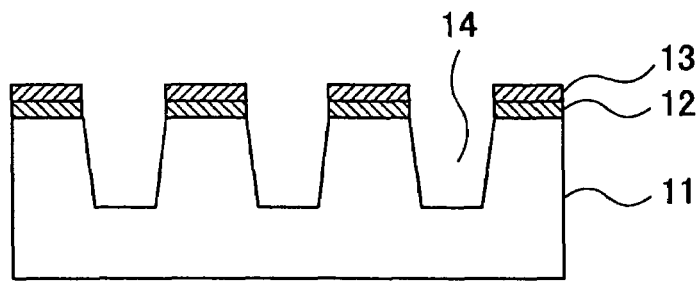
Figure 1C:
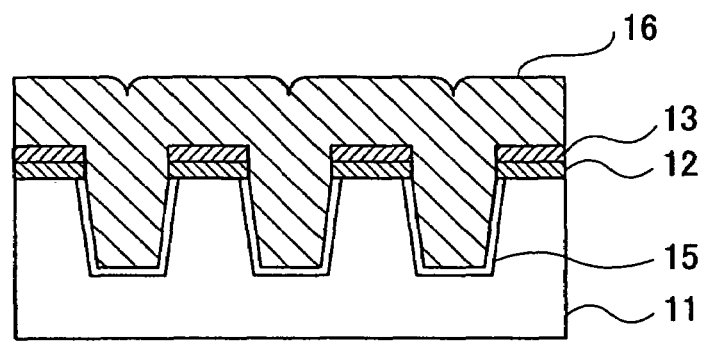
Figure 1D:
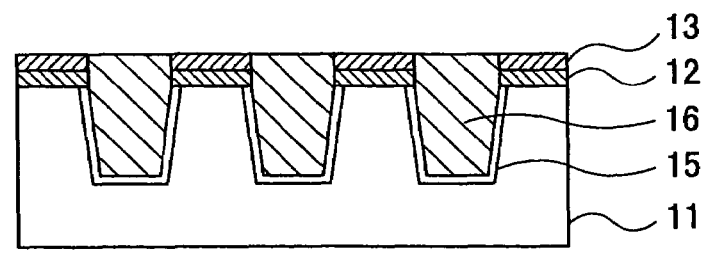
Figure 1E:
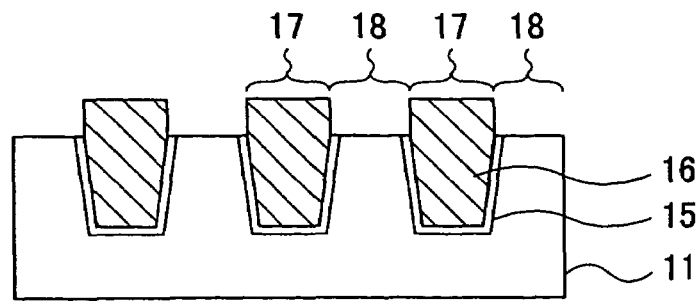
Figure 2:
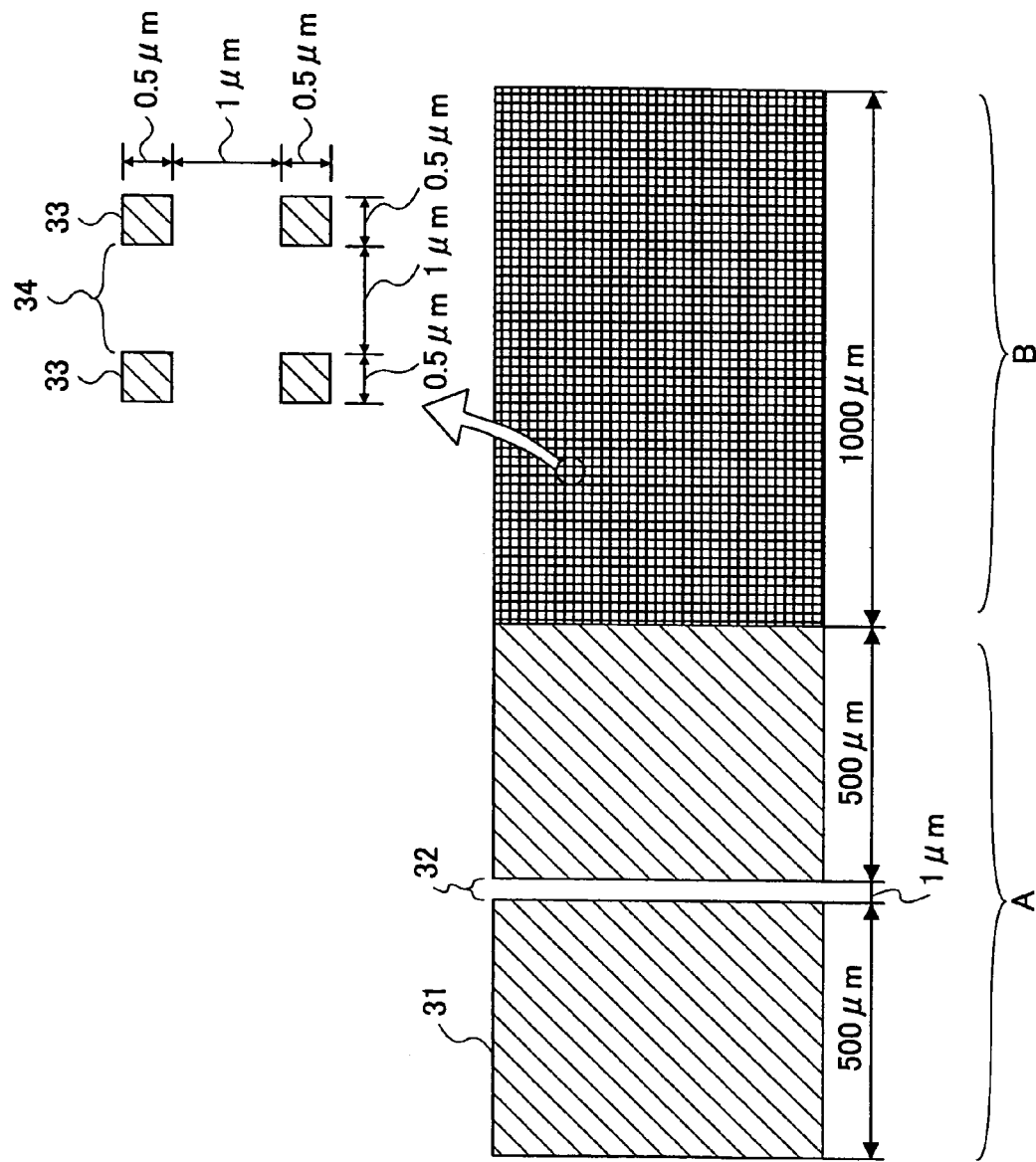
FIG. 2 is a diagram showing an example of the substrate carrying thereon device regions and device isolation regions.
Figure 3:
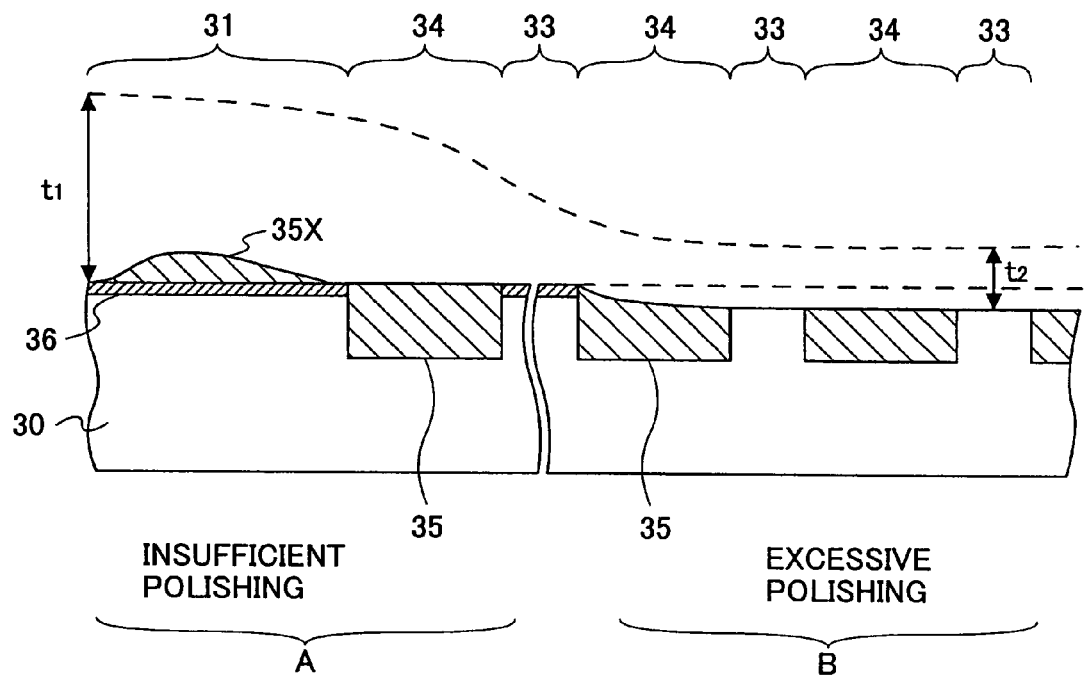
FIG. 3 is a diagram showing the substrate of FIG. 2 after the polishing step.
Figure 4:
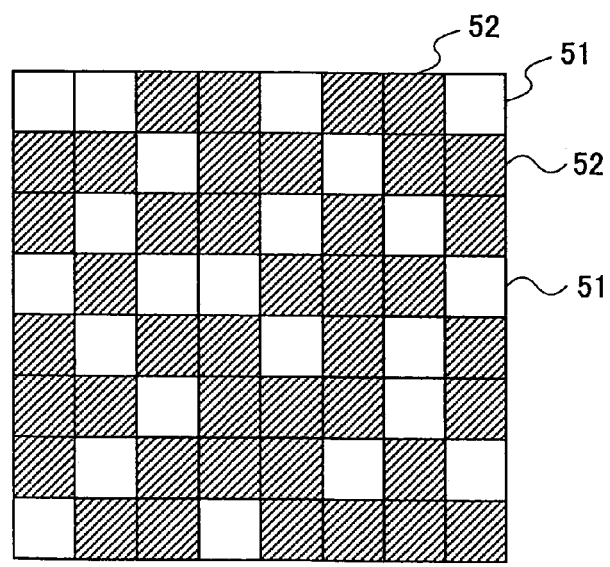
FIG. 4 is a diagram showing a prior art that divides a layout region formed of device regions and device isolation regions into sub-regions having a size of 100 µm per each edge.
Figure 5:
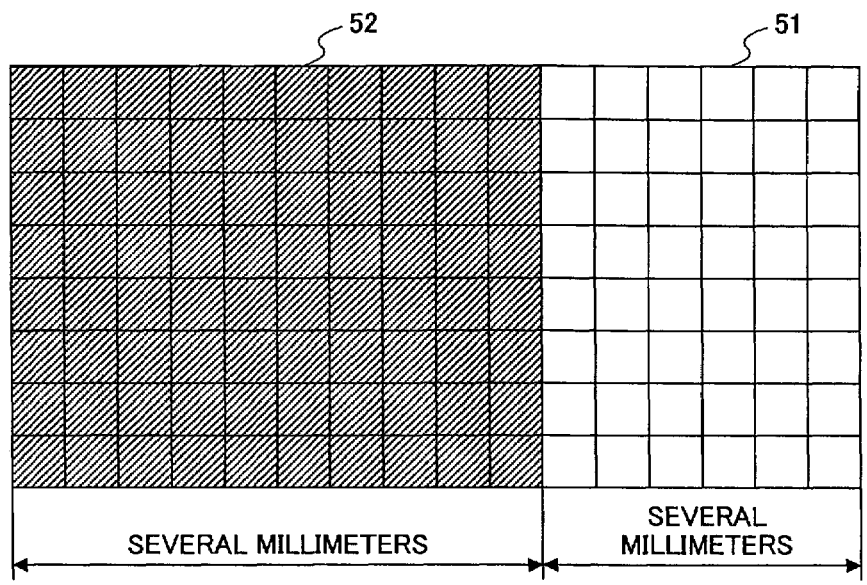
FIG. 5 is a diagram showing the problems that may be caused in the prior art of FIG. 4.
Figure 6:
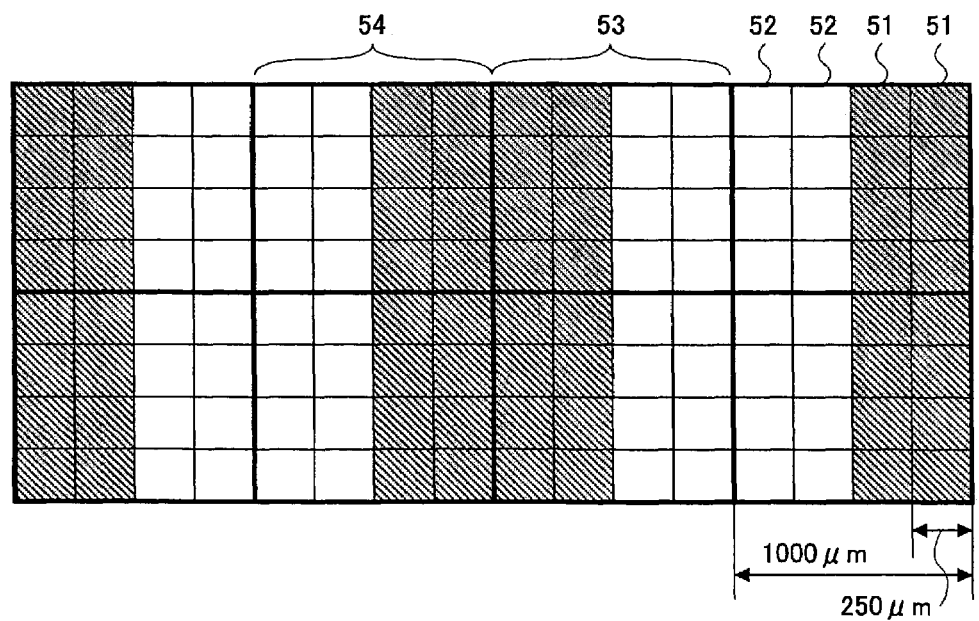
FIG. 6 is a diagram showing another prior art that solves the problems in the prior art of FIG. 5.
Figure 7:
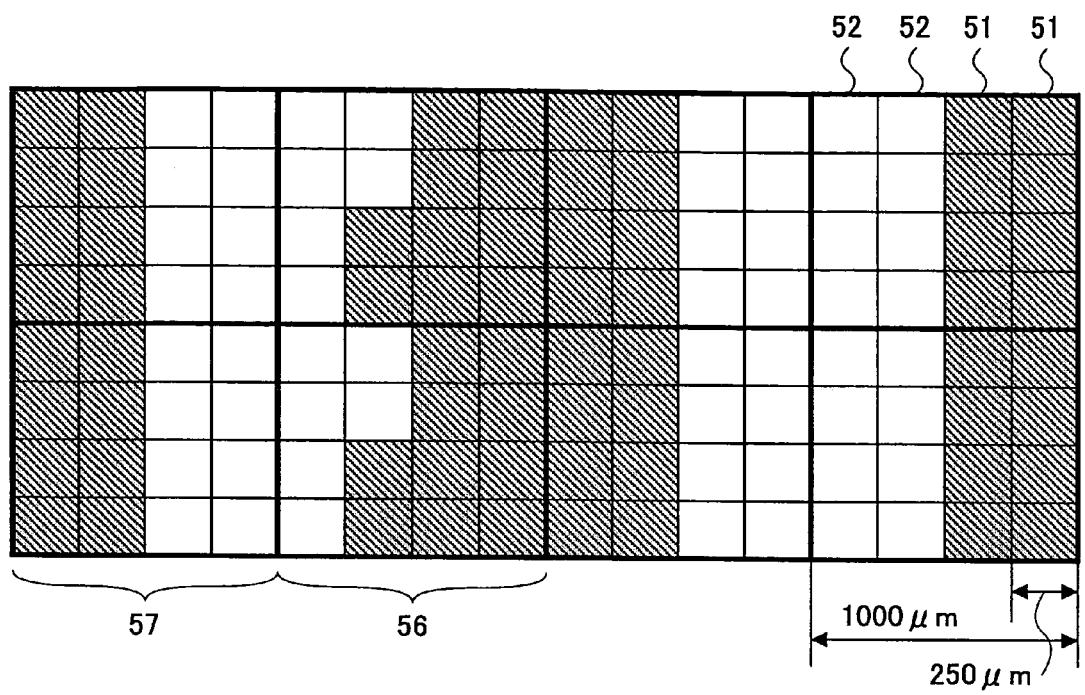
FIG. 7 is an example of layout excluded by the prior art of FIG. 6.
Figure 13:
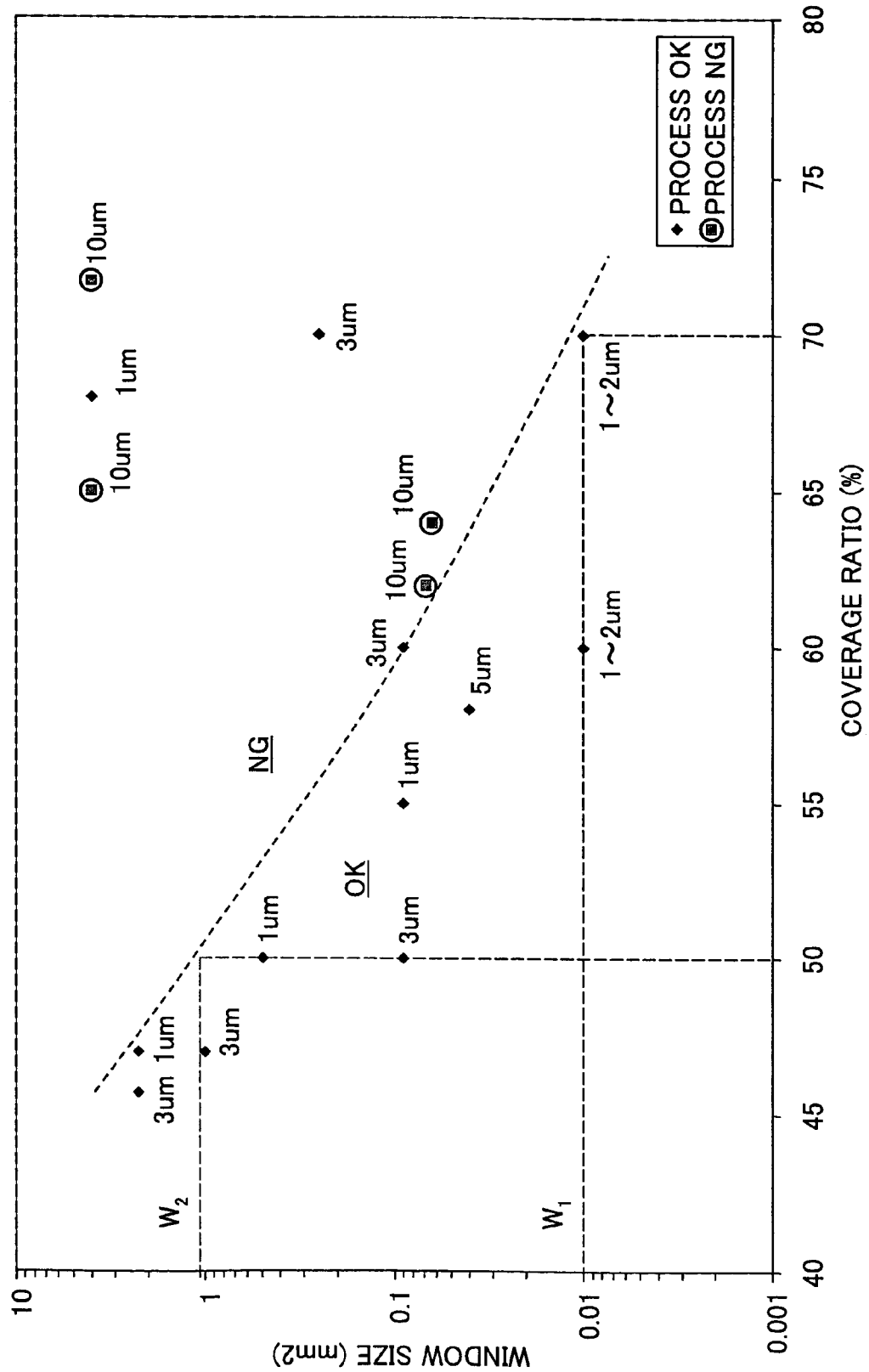
FIG. 13 is a diagram showing the relationship between a window area and the coverage ratio obtained by the experiments constituting the foundation of the present invention for the device regions of various sizes.

FIG. 13 shows the relationship between coverage ratio of the device regions and the size of the pattern of the device region in which satisfactory polishing result has been obtained with the foregoing polishing experiment. Here, "satisfactory polishing result" means that there occurs no insufficient polishing or excessive polishing explained previously with reference to FIG. 3 after the polishing has been made. In FIG. 13, it should be noted that the horizontal axis represents the coverage ratio of the device regions while the vertical axis represents the area of the region or window used for measuring the coverage ratio of the device regions. Reference should be made to FIG. 6 or FIG. 7.

Referring to FIG. 13, it can be seen that satisfactory polishing is achieved even when the coverage ratio of the device regions has a lave value of about 70%, provided that the window has a small size $W_1$ of 100 µm×100 µm. On the other hand, the relationship of FIG. 13 also indicates that no satisfactory polishing is achieved when the window is set to a large value $W_2$ of 1000 µm×1000 µm, for example, unless the coverage ratio of the device regions is suppressed to 50% or less. Further, in the case the window has an intermediate size of about 300 μm×300 μm, it will be noted that the coverage ratio of the device regions has to be suppressed to 60% or less for achieving satisfactory result of polishing.

Thus, FIG. 13 shows that, in order to achieve excellent polishing result at the time of forming the device isolation regions 101A and device regions 101B on the silicon substrate 101, there is a need of optimization of the coverage ratio of the device regions not only locally by using a small window size but also over a larger region by using a larger window size. This result of FIG. 13 is in conformity with the conclusion of Japanese Laid-Open Patent Application 2003-347406.

In FIG. 13, it should further be noted that representation of each data point is accompanied with a parameter, while this parameter indicates the length of the shorter edge of the device region corresponding to that data point.

Now, in FIG. 13, it can be seen that there exist data points that show satisfactory polishing result even though the coverage ratio of the device regions takes a large value of 65% or more and a large window size of 0.2 mm² or 3 mm² is used.

It will be noted that these exceptional data points have a common feature in that the length of the shorter edge of the device region is less than 5 μm, such as 1 μm or 3 μm.

It is believed that the foregoing result of FIG. 13 reflects the situation in that, when an insulation film 103 such as a silicon oxide film is deposited so as to fill the device isolation trenches 101A in the case the device regions has an edge length of 5 μm or less, the thickness of the insulation film 103 deposited on the nitride film 102b on the substrate 101 is reduced as explained with reference to FIG. 10B, and thus, the desired structure in which the device isolation trenches 101A are filled with the device isolation film patterns 103A is obtained by merely polishing out the minute projections and the thin insulation film 103 remaining on the silicon nitride film 102b.

This means that, at the time of designing of an electronic device such as a semiconductor device according to the procedure of the Japanese Laid-Open Patent Application 2003-247406, in which optimization of layout is made with regard to the coverage ratio of the device regions for each of the first sub-regions having a first size and then for each of the second sub-regions having a second, different size, there arises no problem at all when the device regions having an edge size of 5 μm or less are eliminated from the calculation of the coverage ratio.

By eliminating the device regions having a shorter edge of 5 μm or less from the calculation of the coverage ratio, it becomes possible to layout such minute device regions freely and as desired on the surface of a substrate, and the degree of freedom of design is improved for the electronic devices that includes ultrafine elements such as ultra high-speed semiconductor integrated circuit.

Embodiment

Figure 14:
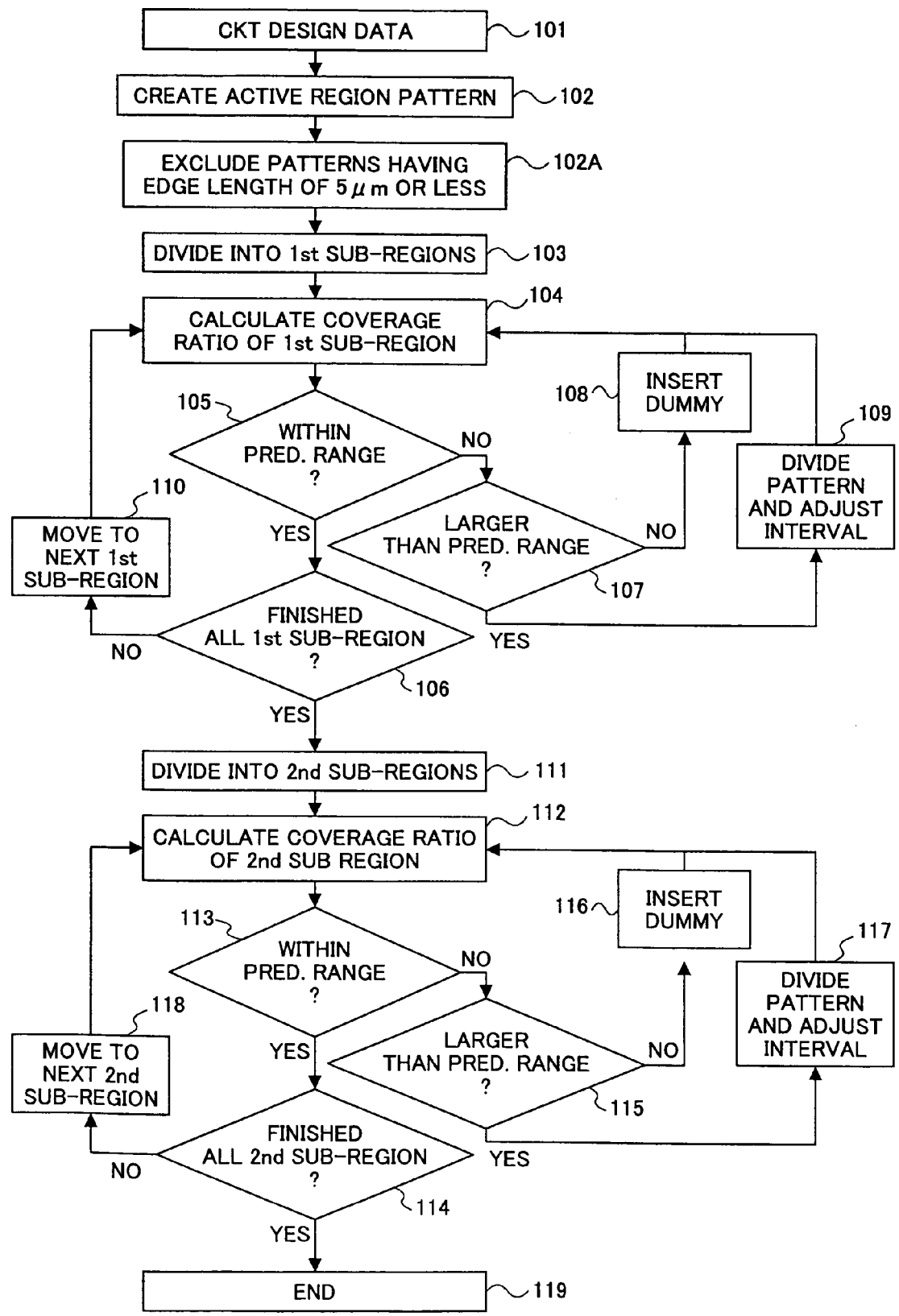
FIG. 14 is a flowchart showing a designing method of an electronic device according to an embodiment of the present invention.

FIG. 14 is a flowchart showing the designing process of a semiconductor integrated circuit device according to an embodiment of the present invention.

More specifically, the designing process of semiconductor integrated circuit device of the present invention provides an automatic process of designing the pattern for the active regions of MOS transistors that constitute the semiconductor integrated circuit device, particularly the pattern that includes therein device regions and device isolation regions defining the device regions and formed on a semiconductor substrate by an STI process.

Referring to FIG. 14, the design process is started with the step 101, and circuit design data determined in correspondence to the functions required for the semiconductor integrated circuit are created according to a known design method.

Next, in the step 102, the pattern of active regions of MOS transistors such as the one shown in FIG. 15A are created from the design data.

Referring to FIG. 15A, the pattern of the active regions thus created includes the device regions having the shorter edge exceeding 5 μm and the device regions having the shorter edge of which length is 5 μm or less.

Next, in the step 102A, the device regions having the length of 5 μm or less for the shorter edge are eliminated from the pattern of the active regions, and thus, only the active regions having the length exceeding 5 μm for the shorter edge are extracted as represented in FIG. 15B.

Next, in the step 103, the layout region including the pattern of the active regions extracted in the step 102A is divided uniformly into first sub-regions having a first size. Here, it should be noted that the first sub-region is defined to have a size smaller than the size of the second sub-regions to be described, such as 100 μm×100 μm. With this, the active regions are also divided into the first sub-regions. It should be noted, however, that the first sub-region is not limited to the foregoing size of 100 μm×100 μm but can have any suitable size between the size of 50 μm×50 μm and 300 μm×300 μm.

Next, in the step 104, the coverage ratio of the device region is calculated for each of the first sub-regions, wherein the coverage ratio is defined for a first sub-region as: (total area of device regions in the first sub-region)/(area of the first sub-region)×100.

Next, in the step 105, a discrimination is made whether the coverage ratio of the first sub-region falls in a predetermined range, wherein it is preferable to set the foregoing predetermined range to be 70% or less in view of FIG. 13 in the case the first sub-regions have the size of 100 μm×100 μm. Further, the lower limit of the coverage ratio of the first sub-region is preferably set to 20% or more in view of the Japanese Laid-Open Patent Application 2003-347406.

When the coverage ratio obtained in the step 104 falls in a predetermined range noted before, the design process proceeds to the step 106, while when the coverage ratio falls outside the foregoing range, discrimination is made in the step 107 whether or not the value of coverage value is larger than the foregoing predetermined range.

When it is determined in the step 107 that the coverage ratio is smaller than the predetermined range, the design process proceeds to the step 108 and dummy patterns of device regions are added to the first sub-region. With this, the coverage ratio of the device region is increased.

When, on the other hand, the coverage ratio is larger than the foregoing predetermined range, the step 109 is conducted in which the pattern inside the foregoing first sub-region is divided. Alternatively, the separation between the regions having a function is adjusted. With this, the coverage ratio is decreased.

After this, the process returns to the step 104, and the foregoing steps are repeated until the coverage ratio falls in the foregoing predetermined range.

Figure 16:
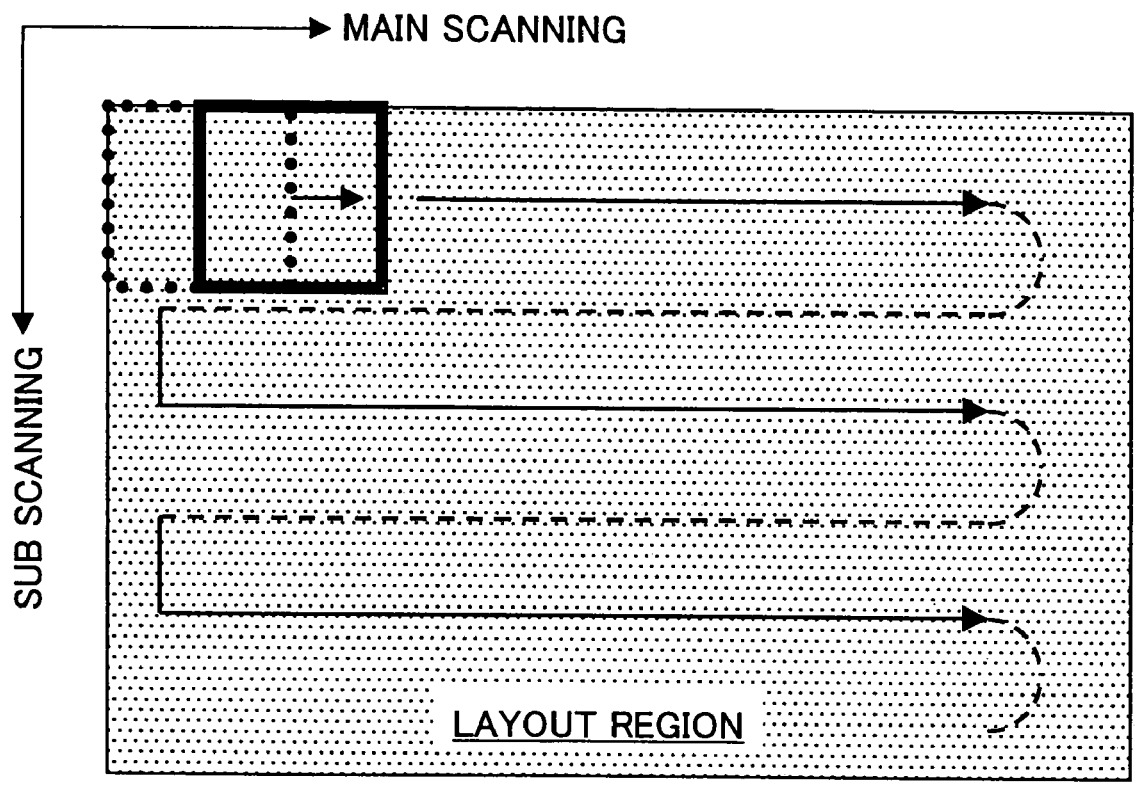
FIG. 16 is a diagram showing an example of scanning of surface of the substrate according to an embodiment of the present invention.

Next, in the step 106, discrimination is made whether or not the examination of the coverage ratio has been completed for all of the first sub-regions, and if the result is NO, the step 110 is conducted in which the examination process is moved to the next first sub-region as represented in FIG. 16. Thereafter, the process returns to the step 104 and the foregoing steps are repeated.

Referring to FIG. 16, it will be noted that the movement of the first sub-region is conducted line sequentially in the main scanning direction and also in the sub-scanning direction, wherein it is preferable to set, when moving from a first sub-region to a next first sub-region, the distance of the movement to be ¾ or less of the window, in other words the edge length of the first sub-region for both of the main scanning direction and the sub scanning direction such that the first sub-region and the second first sub-region overlap partially. A similar partially overlapped line-sequential scanning of the layout region is made also for the second sub-regions as will be explained with reference to the step 118.

When the coverage ratio has successfully fallen into the predetermined range for all of the first sub-regions, the step 111 is conducted in which the layout region is divided uniformly into second sub-regions having a size different from the size of the first sub-region. With this, the pattern of the active regions shown in FIG. 15B is divided into the foregoing second sub-regions, wherein it is preferable to choose the size of the second sub-regions to be larger than the first sub-regions such as the size of 300 μm×300 μm. When the second sub-regions are set to have a size smaller than the first sub-regions, there can be a case in which adjustment becomes necessary for the first sub-regions after discrimination of the coverage ratio has been made for the second sub-regions. In such a case, the number of the adjustment steps increases and the layout process becomes complicated. By setting the size of the second sub-regions to be larger than the first sub-regions, it is possible to improve the efficiency of designing the electronic devices.

Next, in the step 112, the coverage ratio is calculated for each of the second sub-regions, wherein the coverage ratio is defined as being equal to (total area of device regions in the second sub-region)/(area of the second sub-region)×100.

Next, in the step 113, discrimination is made whether or not the coverage ratio of the second sub-region falls in a predetermined range. Here, it should be noted that the foregoing predetermined range is determined from the relationship of FIG. 13 in correspondence to the size of the second sub-regions and may be set to 60% or less when the second sub-region has the size of 300 μm×300 μm. On the other hand, the lower limit of the second sub-regions may be set to 20-30% in view of the teaching of the foregoing Japanese Laid-Open Patent Application 2003-347406.

It should be noted that the size of the second sub-regions is not limited to the size of 300 μm×300 μm but may be chosen arbitrarily within the range from 300 μm×300 μm to 1000 μm×1000 μm. For example, in the case the second sub-region is set to have the size of 1000 μm×1000 μm, the coverage ratio is set to 50% or less from the relationship of FIG. 13.

When the foregoing coverage ratio falls in the foregoing predetermined range, the design process proceeds to the step 114, while when the coverage ratio falls outside the predetermined range, an examination is made in the step 115 whether or not the value of the coverage ratio is larger than the predetermined range.

When it is determined as a result of discrimination in the step 115 that the coverage ratio is smaller than the predetermined range, dummy device regions are added in the step 116. When it is determined, on the other hand, that the coverage ratio exceeds the predetermined ratio, the step 117 is conducted in which the pattern in the second sub-region is divided. Alternatively, the separation between the regions having a function is adjusted, and the process returns to the step 112 for re-calculation of the coverage ratio. Further, the foregoing steps are repeated until the coverage ratio falls in the foregoing predetermined range.

Next, in the step 114, discrimination is made whether or not the examination of the coverage ratio has been completed for all of the second sub-regions, and if the result is NO, the process proceeds to the step 118 in which the next second sub-region is selected. Further, the design process returns the step 112 and repeats the foregoing steps.

When the coverage ratio has successfully fallen into the foregoing predetermined rage for all of the second sub-regions, the layout processing is terminated at the step 119.

Now, when the coverage ratio does not fall in the predetermined rage for all of the second sub-regions, it is possible to change the allowable range of the coverage ratio for the first sub-regions and carry out the steps 104-119 again.

While the present embodiment has been explained for the case of the pattern of active regions, the designing process of the present invention is applicable generally to the regions such as interconnection patterns to which a CMP process is applied.

On the substrate thus carrying the layout determined according to the foregoing designing process, there is formed an STI structure according to the known process explained previously with reference to FIGS. 1A-1E. Thus, there is formed a device isolation trench so as to surround the device regions and the device isolation trench thus formed is filled with a silicon oxide film deposited by a high-density plasma CVD process. Thereby, the excessive silicon oxide film on the silicon substrate is polished out by a chemical mechanical polishing process.

Because the device regions having a size exceeding 5 μm for the shorter edge are disposed with an optimum arrangement, and thus, a uniform polishing is guaranteed when a chemical mechanical polishing process is conducted. Thus, there occurs no problem of defective polishing explained previously with reference to FIG. 3.

Further, in the present invention, it is possible to dispose the device regions having an edge length of 5 μm or less arbitrarily, and thus, it becomes possible to dispose ultrafine semiconductor devices in such minute device regions arbitrarily. Thereby, it becomes possible to fabricate a high-performance and high-functional semiconductor integrated circuit easily.

Figure 17:
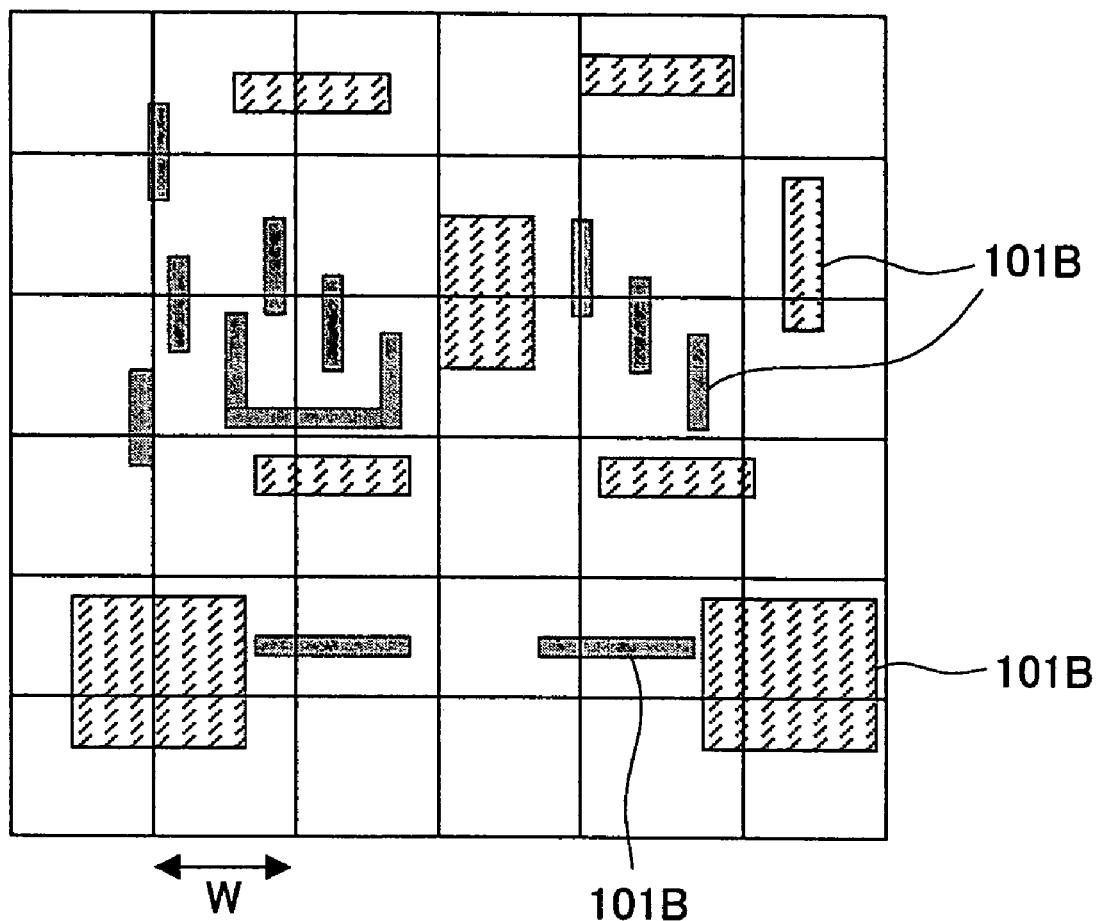
FIG. 17 is a diagram showing an example of the semiconductor integrated circuit device designed according to an embodiment of the present invention.

FIG. 17 is a schematic diagram showing an example of the semiconductor integrated circuit having a layout determined according to the designing process of the present invention.

Referring to FIG. 17, the semiconductor integrated circuit device includes first type device regions characterized by a shorter edge length exceeding 5 μm and second type device regions characterized by a shorter edge length of 5 μm or less, wherein it will be noted that the coverage ratio of the second type device regions becomes 70% or less in conformity with the relationship of FIG. 13 when a mesh having a width W of 100 μm for each edge is applied to the semiconductor integrated circuit. Further, when a mesh having a width W of 300 μm for each edge is applied to the same semiconductor integrated circuit, the coverage ratio of the second type device regions becomes 60% or less also in conformity with the relationship of FIG. 13. Further, in the case a mesh having a width W of 1000 μm for each edge is applied to the same semiconductor integrated circuit, the coverage ratio of the second type device regions becomes 50% or less in conformity with the relationship of FIG. 13.

On the other hand, when the mesh having the width W of 100 μm for each edge is applied to the same semiconductor integrated circuit, the coverage ratio of both the first type device regions and the second type device regions becomes 70% or more in the example of FIG. 17.

While the present invention has been explained with regard to the layout process of device regions in a semiconductor integrated circuit, the present invention is effective also in other cases of chemical mechanical polishing of an object that includes both patterns having a size exceeding 5 μm and patterns having a size of 5 μm or less, as in the case of interconnection patterns formed in a multilayer interconnection structure of a semiconductor integrated circuit or other devices such as thin film magnetic heads, CCD devices, laser diodes, and the like.

What is claimed is:

1. An electronic device, comprising:
    a substrate;
    device regions formed on said substrate; and
    device isolation regions formed on said substrate,
    said device regions being formed to occupy an area of 70% or less of said substrate in a region thereof having a size of 100 μm per each edge in the case patterns having an edge length of 5 μm or less for a shorter edge are eliminated,
    said patterns having an edge length of 5 μm or less for said shorter edge being formed so as to occupy an area of 70% or more in regions on said substrate having a size of 100 μm for each edge.

2. The electronic device as claimed in claim 1, wherein said device regions are formed such that a coverage ratio thereof in a region of said substrate having a size of 300 μm for each edge becomes 60% or less when said patterns having a shorter edge of 5 μm or less are excluded.

3. The electronic device as claimed in claim 1, wherein said device regions are formed such that a coverage ratio thereof in a region of said substrate having a size of 1000 μm for each edge becomes 50% or less when said patterns having a shorter edge of 5 μm or less are excluded.

* * * * *